United States Patent [19]

Whitney et al.

[11] 3,708,720

[45] Jan. 2, 1973

[54] SEMICONDUCTOR THERMAL PROTECTION

[75] Inventors: John A. Whitney, Allen; Richard E. Woods, Markle, both of Ind.

[73] Assignee: Franklin Electric Co., Inc., Bluffton, Ind.

[22] Filed: Jan. 2, 1973

[21] Appl. No.: 152,622

[52] U.S. Cl. ............. 317/13 C, 307/252 N, 307/310, 317/41, 317/33 SC, 317/235 P, 317/235 Q, 318/473

[51] Int. Cl. .............................................. H02h 5/04

[58] Field of Search ......... 317/13 C, 13 A, 41, 33 SC, 317/235 P, 235 Q; 318/473, 221 R, 221 A, 221 C, 332; 307/252 N, 303, 310

[56] References Cited

UNITED STATES PATENTS

| | | | |
|---|---|---|---|
| 3,569,781 | 3/1971 | Strachan | 317/41 X |
| 3,562,587 | 2/1971 | Forst | 317/41 X |
| 3,555,362 | 1/1971 | Quinn | 317/41 X |
| 3,543,090 | 11/1970 | Pfister et al. | 317/13 C |

*Primary Examiner*—James D. Trammel
*Attorney*—Axel A. Hofgren et al.

[57] ABSTRACT

To prevent excessive semiconductor junction temperatures, thermally responsive impedances are mounted in heat transfer contact with the semiconductor device. Various combinations of impedances including positive and negative temperature coefficient thermistors, semiconductor diodes, transistors and thyristors are located in electrical series or shunt circuits which disable current flow through an adjacent semiconductor junction when the temperature thereof exceeds predetermined values. Load circuits in series with a thermally protected semiconductor device are protected from excessive load currents which might damage the load and/or the semiconductor device.

17 Claims, 12 Drawing Figures

INVENTORS
JOHN A. WHITNEY
RICHARD E. WOODS
BY Hofgren, Wegner, Allen, Stellman & McCord.
ATTORNEYS.

SEMICONDUCTOR THERMAL PROTECTION

This invention relates to thermal protection of semiconductor devices, and more particularly to thermally responsive means for limiting or shunting current flow in a plurality of semiconductor layers.

Most semiconductor devices of three or more layers must be operated in a manner which insures that their junction temperatures remain below a critical value. In thyristors, current in excess of a rated operating maximum may so heat the semiconductor junctions as to result in loss of gate control, making it impossible to turn off the thyristor. To obviate thermal overload problems, a semiconductor chip can be used which is large enough to sustain large steady state current. This approach is expensive and still requires external load protection if the connected load may itself overheat. Another approach suggested for motor control circuits is to energize temperature coefficient resistors for a specified time period, but high inertia loads and long acceleration start times pose difficult application problems.

In accordance with the present invention, semiconductor devices such as thyristors are thermally protected by internal impedances located in electrical series or shunt with one or more electrodes of the semiconductor layers. In one embodiment, polycrystalline ceramic material having a positive temperature coefficient is located in series with the gate of a thyristor. In another embodiment, negative temperature coefficient devices shunt two electrodes of a thyristor.

One object of this invention is the provision of an improved semiconductor device having temperature responsive material mounted to thermally protect one or more semiconductor junctions.

Another object of this invention is the provision of an improved load circuit in which current which produces heating is passed through a thermally protected thyristor.

Other features and advantages will be apparent from the following description, and from the drawings, in which.

Figure 1:
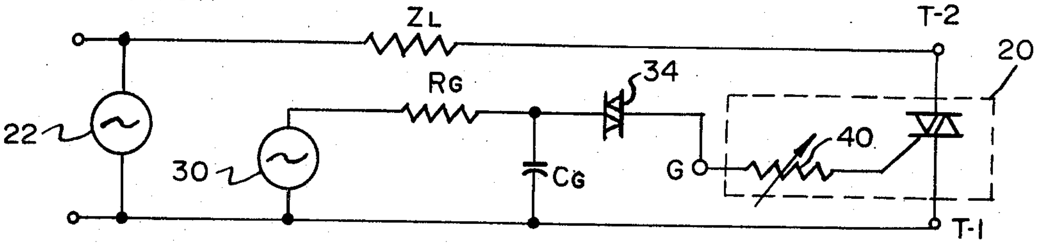
FIG. 1 is a schematic diagram of a thyristor control circuit incorporating a thermally protected thyristor.

While illustrative embodiments of the invention are shown in the drawings and will be described in detail herein, the invention is susceptible of embodiment in many different forms and it should be understood that the present disclosure is to be considered as an exemplification of the principles of the invention and is not intended to limit the invention to the embodiments illustrated.

Figure 2:
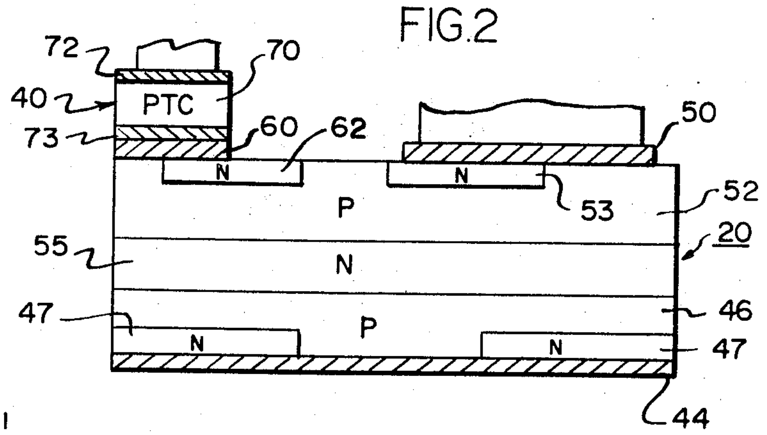
FIG. 2 is a cross-section of a semiconductor pellet forming the thyristor of FIG. 1.
Figures 3, 4:
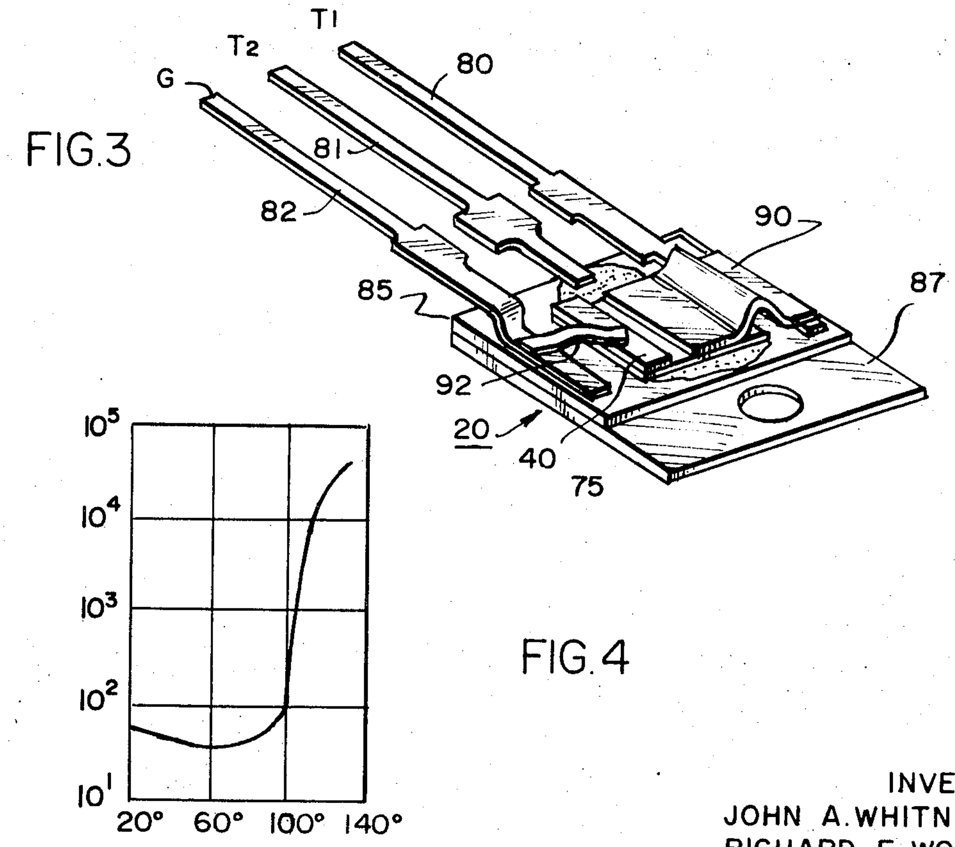
FIG. 3 is a perspective view of a thyristor package utilizing the semiconductor pellet of FIG. 2.
FIG. 4 is an impedance versus temperature curve of PTC material used in forming the thyristor of FIGS. 2 and 3.

Turning to the drawings, FIG. 1 illustrates a control circuit using a thyristor 20 shown in detail in FIGS. 2 and 3. Thyristor 20 is connected to gate current from an AC source 22 through a load impedance $Z_L$. The exemplary illustrated thyristor is a triode AC semiconductor switch or triac having a pair of main current terminals T1 and T2, and a trigger or gate terminal G. If unidirectional current flow is to be gated to load $Z_L$, thyristor 20 can take the form of a unidirectional AC switch device such as a silicon controlled rectifier or SCR. Other switching or variable controlled conduction devices can also be utilized, such as transistors and other semiconductor devices having three or more semiconductor layers.

Trigger or gate control for thyristor 20 may be provided by any known circuit, one of which is diagrammatically illustrated. An AC source 30 having a phase synchronized with the phase from AC source 22 is coupled to an RC time constant network consisting of a resistor $R_G$ and a capacitor $C_G$. The junction between resistor $R_G$ and capacitor $C_G$ is coupled through a four layer semiconductor device 34, such as a diac, to terminal G. As the voltage across capacitor $C_G$ reaches the break-over voltage of diac 34, the diac is driven into an avalanche condition and current passes to electrode G, gating thyristor 20 from its nonconducting state to its conducting state. After capacitor $C_G$ discharges so that the current through diac 34 is not sufficient to maintain conduction, the diac reverts to its blocking state and thyristor 20 is deenergized at the following current zero point when the current falls below the necessary holding value.

Many conditions can cause thyristor 20 to carry current in excess of its maximum rating, increasing the junction temperature beyond a critical level such as 125° C. For example, if load $Z_L$ is a motor winding, a locked rotor will cause excessive load current to flow. An internal device failure, such as loss of a heat sink, will also overheat the internal device semiconductor junctions. Once the critical junction temperature is exceeded, gate control may be lost. Turn off is further aggravated by increased gate trigger sensitivity as temperature increases. For example, in a triac having a 6 to 8 ampere maximum current rating, the typical gate trigger requirements will change from 25 milliamperes, 1.2 volts DC at 25° C. to 8.75 milliamperes, 0.84 volts DC at 100° C.

To prevent thermal destruction, a positive temperature coefficient (PTC) thermistor 40 is located in series between an internal gate and the external gate terminal G. The internal construction of such a modified thyristor is illustrated in detail in FIGS. 2 and 3. A rectangular silicon pellet has a metalized soldered surface 44 making ohmic contact to a P-type semiconductor emitter layer 46 and an N-type semiconductor emitter layer 47. A metalized, soldered surface 50 makes ohmic contact with a P-type semiconductor emitter layer 52 and an N-type semiconductor emitter layer 53. An N-type semiconductor base layer 55 is located between the pair of P-type emitter layers 46 and 52. To form a gate or control electrode, a metalized soldered surface 60 contacts the P-type emitter layer 52 and a further N-type semiconductor emitter layer 62. The above described construction is known and effectively forms two four layer switches in parallel but oriented in opposite directions.

In accordance with the present invention, a PTC material 40 is electrically and thermally mounted in series with the metal gate surface 60. For this purpose, a PTC chip having the same dimensions as the gate surface area is constructed of polycrystalline ceramic material 70 located between a pair of planar electrodes 72 and 73 which are high temperature solder-coated or tinned and suitable for 125° C. operation. For the triac chip construction of FIG. 3, the PTC wafer would typically measure 0.140 inches long by 0.040 inches wide, and be as thin as practically possible. The material 70 is prepared from mixtures of barium, strontium, and lead titanates with traces of certain impurity ions substituted in the crystallattice. Variations in the composition will result in various switching temperatures.

For the illustrated device, the PTC mixture was chosen to produce the logarithmic plate of resistance versus temperature illustrated in FIG. 4, in which the tetragonal-to-cubic transition temperature (Curie temperature) occurred at approximately 100° C. For temperatures in excess of the Curie temperature, the semiconducting PTC material exhibits a sudden, large increase in resistivity. For example, the resistance between surfaces 72 and 73 will switch from a resistance value of 50 ohms or so below 100° C. to resistance values in excess of 10,000 ohms prior to reaching 120° C. The exact Curie point of the PTC material 70 is chosen considering the thermal mass of the device which results in a tracking temperature lag as the temperature of the P-N junctions increase. Thus, thermistor 40 is selected to switch at a temperature (as 100° C.) lower than the critical temperature (as 120° C.) of the semiconducting device in order to compensate for the temperature tracking lag.

The semiconductor device of FIG. 2 may be packaged as illustrated in FIG. 3. External terminals T1, T2 and G, are formed by three metal leads 80, 81, and 82, respectively, which are attached to a beryllium oxide substrate 85 which forms an electrical insulator but a thermal conductor. A metal heat sink 87 is attached to the bottom of the substrate 85 to dissipate the heat generated by current flow within the pellet 20. If desired, substrate 85 can be eliminated by directly bonding the metal heat sink 87 to soldered surface 44 of the pellet, causing the heat sink to form the T2 terminal.

A metal bridge 90 connects the lead 80 to the soldered surface 50 of the pellet. A metal bridge 92 connects the upper planar solder surface 72 to the lead 82. A metal or solder surface 95 deposited on the center section of the substrate 85 serves to connect the soldered surface 44 (FIG. 2) to the lead 81.

In operation, heating of the triac pellet is directly transferred through the soldered surfaces 60 and 73 to the PTC polycrystalline material 70, causing the temperature of the material to rise. When the Curie point is exceeded, the PTC material 70 switches to a very high resistance which prevents gate turn on by the signal from capacitor $C_G$, FIG. 1. After the pellet cools sufficiently, the PTC thermistor material will switch or return to a low resistance in the range of 35 to 100 ohms or so, reducing the latching current required at terminal G and thus allowing the circuit of FIG. 1 to regain control over the triggering of the thyristor 20.

Figure 5:
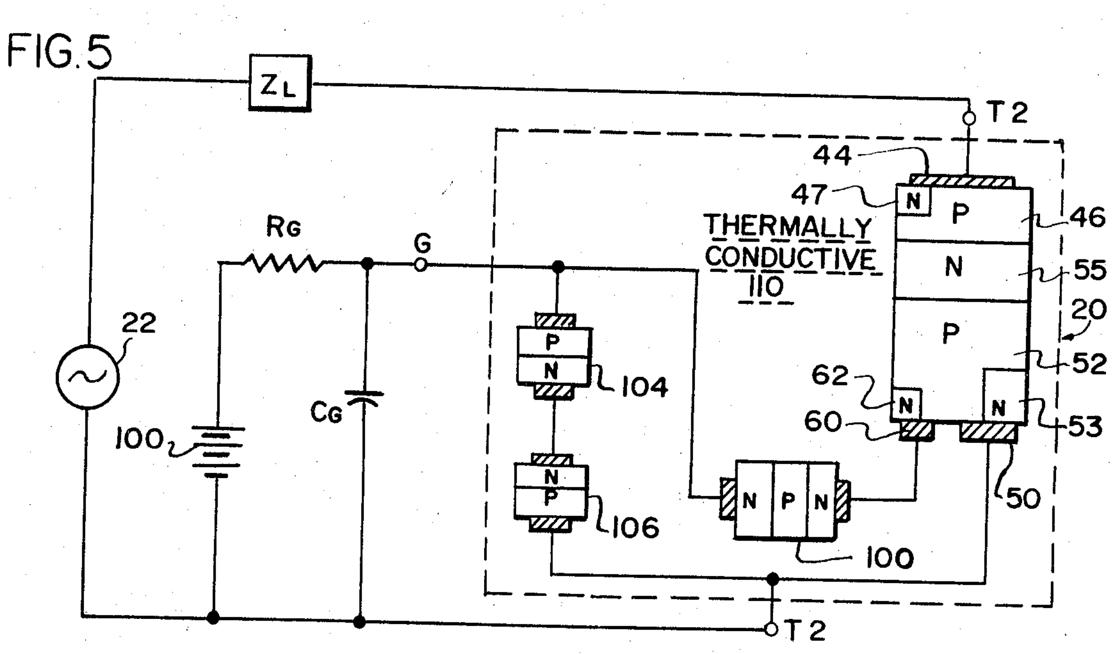
FIG. 5 is a junction and schematic diagram of a modified thermally protected thyristor and associated control circuit.
Figure 6:
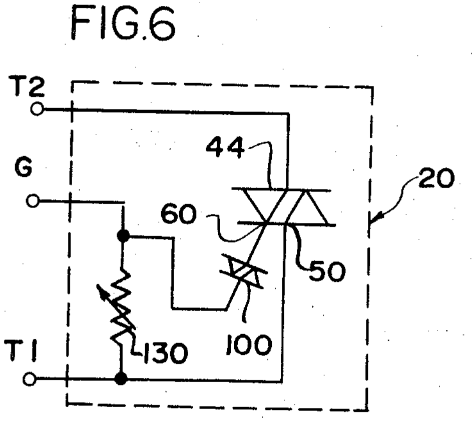
FIGS. 6, 7, 8, 9 and 10 are schematic diagrams of alternate embodiments of a thermally protected thyristor.

In the remaining figures, other forms of thermal protection for semiconductor pellets and their connected loads are illustrated. In FIG. 5, the illustrated thyristor control circuit is generally similar to FIG. 1, but the AC source 30 has been replaced by a DC source 100 which generates a trigger pulse to terminal G. The triac pellet is generally similar to the pellet of FIG. 2. However, other shapes such as circular could of course be substituted for the rectangular pellet construction shown in FIGS. 2 and 3, with appropriate changes in the location of the P-type and N-type layers.

In FIG. 5, an NPN device 100, such as a diac or SBS, is connected in series between solder surface 60 and external terminal G. The diac 100 performs the function of the external diac 34 in FIG. 1, allowing elimination of a separate external break-over device. A pair of Germanium diodes 104 and 106, poled in opposed directions, are connected in series between external terminal G and external terminal T1. The solder surface 50 is connected to terminal T1, thus placing the diodes 104 and 106 in shunt across the pair of electrodes 60 and 50. A thermal conductor 110 connects the diodes 104 and 106 and the PNPN layers of the triac pellet. Material for conductor 110 may be beryllium oxide, similar to the substrate 85 in FIG. 3.

The pair of diodes 104 and 106 are formed by junctions between P-type and N-type semiconductor layers. The semiconductor layers are formed by doped Germanium or other material in which the leakage increases greatly above 100° C. Thus, the pair of back-to-back diodes 104 and 106 exhibit a negative temperature coefficient (NTC) which effectively shorts the gate and terminal surface area 60 and 50 when the junction temperature exceeds the critical value. This shunts the triggering signal, preventing the thyristor 20 from being gated into its conducting state. However, the FIG. 5 circuit is more critical than the FIG. 1 circuit because the diodes 104 and 106 are less likely to bond as well as the PTC material, and the diodes do not exhibit the abrupt change in impedance which occurs with PTC polycrystalline material.

Figure 7:
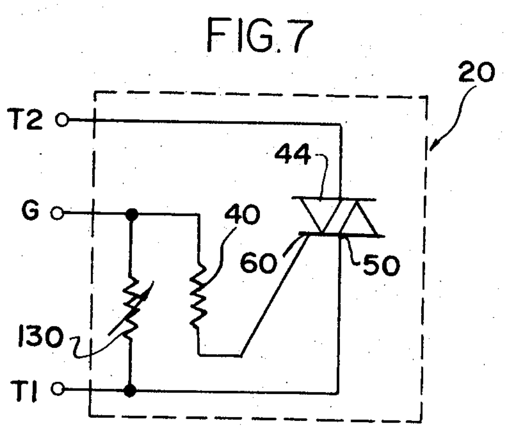
Figure 8:
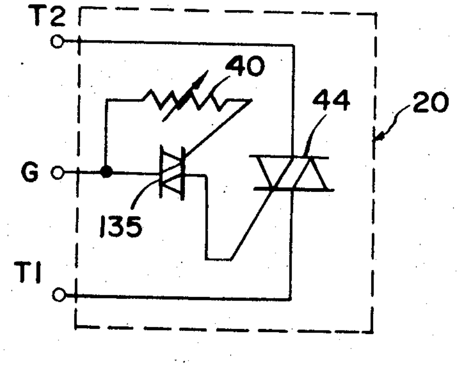

Other alternate constructions for the thyristor 20 are illustrated in FIGS. 6–10. The pair of oppositely poled diodes 104 and 106 of FIG. 5 have been replaced in FIG. 6 with a negative temperature coefficient (NTC) thermistor 130 having a resistance value inversely proportional to temperature. Since NTC thermistors do not exhibit a rapid nonlinear change of resistance, both the series PTC thermistor 40 and the shunt NTC thermistor 130 can be combined to form a gate protection circuit, as seen in FIG. 7. In FIG. 8, an additional PNPN triac 135 has a gate electrode coupled through PTC thermistor 40 to the external gate terminal G of thyristor device 20. The triac 135 is connected to utilize self turn-on gate control. Thus, the increase in PTC resistance is used to open circuit the gate electrode, making the FIG. 8 device especially adaptable for use in control circuits generating a large trigger pulse.

Figure 9:
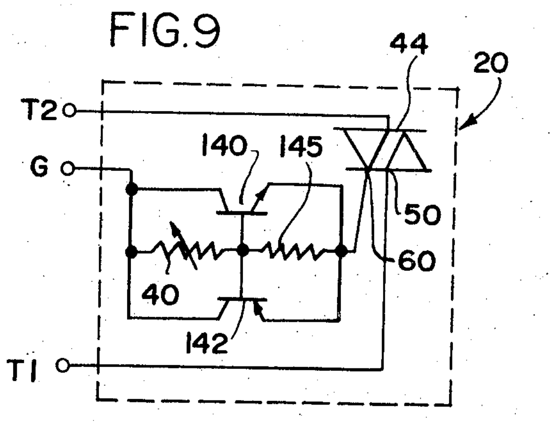
Figure 10:
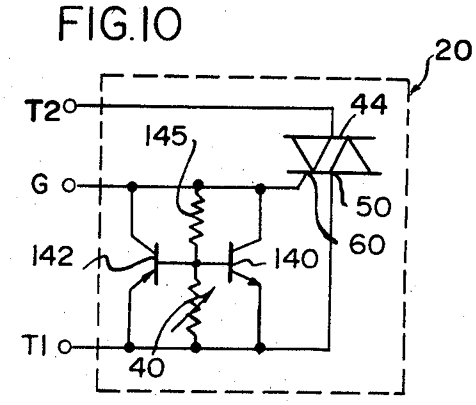

In FIGS. 9 and 10, complementary transistors are used to control the open circuiting or shunting of the gate electrode. For series gate control, FIG. 9, the gate surface 60 is coupled to the emitter electrodes of an NPN transistor 140 and a PNP transistor 142. The collectors of both transistors are directly coupled to external terminal G. For self turn-on biasing, a resistor 145 is located between the base electrodes of transistors 140, 142 and gate area 60. The PTC thermistor 40 is located between the pair of base electrodes and terminal G. When the critical temperature is exceeded, the PTC thermistor 40 essentially opens the base signal path, preventing conduction of transistors 140, 142 and thereby open circuiting the signal path to gate surface 60. If an SCR pellet was substituted for triac pellet 20, transistor 142 could be eliminated since bidirectional triggering would not be required.

In FIG. 10, the transistors and resistances have been rearranged to provide a shunt or short circuit path between the area 60 and 50. As the critical temperature is exceeded, PTC thermistor 40 switches to a high value, generating a large voltage drop thereacross which saturates the single transistor 140 or 142 which is forward biased across its collector-emitter junctions, i.e., dependent on the polarity of the trigger signal between the G and T1 terminals.

Figure 11:
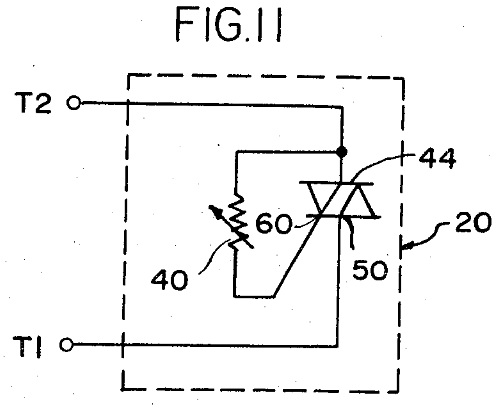
FIG. 11 is a schematic diagram of a modified thyristor for thermally protecting a load.
Figure 12:
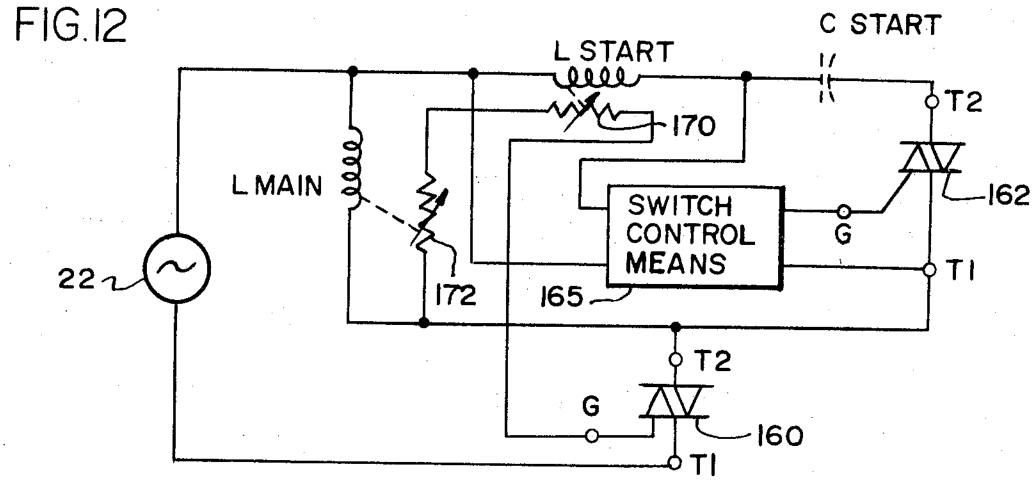
FIG. 12 is a schematic diagram of another thyristor connected to thermally protect a load.

In FIG. 11, the thyristor 20 is connected to provide solid state overload protection for an external load circuit 150 (such as the motor windings shown in FIG. 12). The PTC thermistor 40 is located between the gate area 60 and the T1 area 44, providing automatic turn-on whenever the current through terminals T2 and T1 exceeds the latching current requirements of thyristor 20. Different amounts of external load protection can be provided by altering the device construction. As the PTC thermistor 40 reaches switching temperature, the increased resistance to the triac gate prevents triggering of the triac. The value of current which produces this turn-off operation represents the maximum load current allowed by the circuit. Thus, the semiconductor device simultaneously provides internal semiconductor device protection and external load protection.

In FIG. 12, a different means of providing external load protection is illustrated. A motor start winding switch circuit is shown wherein AC source 22 powers the main winding $L_{MAIN}$ and start winding $L_{START}$ of an AC motor having a protection thyristor 160 in series with AC source 22. The main winding $L_{MAIN}$ is directly coupled through thyristor 160 to AC source 22, whereas the start winding $L_{START}$ is coupled through a separate thyristor 162 to terminal T2 of thyristor 160. Preferably, thyristor 160 is constructed as illustrated for thyristor 20 in FIGS. 1, 2, 3, 5, 6, 7, 8, 9, or 10, thereby providing internal semiconductor device protection and external load protection for series connected winding $L_{START}$. A switch control means 165 is connected across start winding $L_{START}$ and across AC source 22 through thyristor 160.

Switch control means 165 provides a phase sensitive start winding control which generates a trigger signal to thyristor 162 for all phase angles of applied voltage versus start winding current which exceed a preselected range. As the motor speed increases and then exceeds a desired value, the resulting decrease in phase difference between the applied voltage and the start winding current causes switch control means 165 to cease triggering triac 162, taking the start winding out of the circuit. Such a switch control means is described in detail in copending application Ser. No. 72,675, filed Sept. 16, 1970 by John A. Whitney, Richard E. Woods, and William H. Hohman, entitled "Motor Start Winding Switch", and assigned to the same assignee as the present application.

To protect both motor windings $L_{MAIN}$ and $L_{START}$, a pair of PTC thermistors 170 and 172, each similar to thermistor 40 in FIG. 2, are thermally mounted in contact with the end turn area of each of the motor windings $L_{MAIN}$ and $L_{START}$. The pair of PTC thermistors 170 and 172 are electrically placed in series between gate G and terminal T2 of thyristor 160. If a locked rotor condition should occur, the resulting large current passed through the pair of motor windings will produce undesirable heating which can thermally destroy the motor. However, the PTC thermistors 170 and 172 are chosen to heat beyond the Curie point before the motor windings overheat, thereby open circuiting the triggering path for thyristor 160. When the thyristor 160 causes conduction, both the motor windings and the thyristor 162 are thereby thermally protected. Other combinations of control circuits and semiconductor devices will be apparent from the foregoing description.

We claim:

1. A thermally protected semiconductor device, comprising:

a plurality of semiconductor layers for passing therethrough a flow of current which undesirably produces heating, electrode means for electrically contacting at least one of said semiconductor layers to vary said current flow under control of an external signal, variable impedance means having a temperature responsive impedance value, and mounting means for mounting said impedance means between said at least one semiconductor layer and said electrode means to substantially decrease said current flow through said semiconductor layers when a critical temperature is exceeded.

2. The semiconductor device of claim 1 wherein said impedance means has a positive temperature coefficient of impedance in which the impedance value substantially increases when said critical temperature is exceeded, and said mounting means mounts said impedance means in series with said at least one semiconductor layer to substantially decrease the strength of said signal and thereby decrease said current flow through said semiconductor layers.

3. The semiconductor device of claim 2 wherein said impedance means is composed of polycrystalline ceramic material with traces of impurity ions and has a transition temperature above which the impedance thereof increases nonlinearly to values greatly in excess of the impedance variations below said transition temperature.

4. The semiconductor device of claim 2 wherein said plurality of semiconductor layers comprise at least four layers forming a thyristor having a pair of main electrodes through which current flows under control of a gate signal at a gate electrode corresponding to said electrode means, and said mounting means mounts said impedance means in series with said gate electrode to prevent triggering of said thyristor when said critical temperature is exceeded.

5. The semiconductor device of claim 2 wherein said mounting means includes first metal surface means affixed to said one semiconductor layer, said impedance means contacts said first metal surface means, second metal surface means affixed to said impedance means and spaced from said first metal surface means, and terminal means connected to said second metal surface means for external circuit connection to the electrode means of said semiconductor device.

6. The semiconductor device of claim 5 including heat sink means thermally coupled to a different one of said plurality of semiconductor layers to dissipate the heating resulting from current flow.

7. A thermally protected semiconductor device, comprising:

a plurality of first semiconductor layers for passing therethrough a flow of current which undesirably produces heating, electrode means for electrically contacting at least one of said first semiconductor layers to vary said current flow under control of a signal, variable impedance means having a temperature responsive impedance value including resistance means having a resistance value which changes when a critical temperature is exceeded, and a plurality of second semiconductor layers for passing current therethrough under control of a signal at a control electrode, first mounting means for thermally mounting said resistance means in heat transfer contact with said first semiconductor layers and electrically mounting said resistance means to said control electrode, and second mounting means for mounting said second semiconductor layers to said electrode means to substantially decrease said current flow through said first semiconductor layers when said critical temperature is exceeded.

8. The semiconductor device of claim 7 wherein said resistance means has a positive temperature coefficient produced by polycrystalline material having a Curie point near said critical temperature.

9. The semiconductor device of claim 7 wherein said plurality of second semiconductor layers comprise at least four layers of alternate P-type and N-type semiconductor material forming a thyristor, gate terminal means connected to one of said at least four layers to control the switching of said thyristor between substantially nonconducting and substantially conducting states, said first mounting means electrically connecting said gate terminal means to said resistance means.

10. The semiconductor device of claim 7 wherein said plurality of second semiconductor layers comprise at least three alternate P and N type layers forming transistor means, said resistance means being connected by said first mounting means to bias said transistor means.

11. The semiconductor device of claim 10 wherein said first semiconductor layers are responsive to relatively positive and negative signals to produce relatively positive and negative current flow therethrough, and said plurality of second semiconductor layers includes a pair of three alternate P and N type layers forming a first and a second transistor of complementary types.

12. The semiconductor device of claim 7 wherein said impedance means has a substantial change in impedance value when the temperature thereof exceeds a transition temperature, said transition temperature being selected to be less than said critical temperature to compensate for a temperature tracking lag.

13. A thermally protected semiconductor device having a plurality of terminals for external circuit connection, comprising:

a plurality of semiconductor layers for passing therethrough a flow of current which undesirably produces heating, at least one of said semiconductor layers defining a control area for varying the flow of current through said plurality of semiconductor layers in response to the value of a resistance in contact with said control area, base means for mounting said semiconductor layers and said plurality of terminals, variable resistance means having a temperature responsive resistance value, thermal protection means for mounting said variable resistance means in contact with said control area to substantially vary the resistance value thereof when a critical temperature is exceeded, and lead means for connecting said plurality of terminals to different ones of said plurality of semiconductor layers.

14. The semiconductor device of claim 13 wherein said plurality of semiconductor layers comprise at least four layers forming a thyristor, said plurality of terminals includes two main terminals and one gate terminal, said lead means connects said gate terminal to said control area and said two main electrodes to spaced layers, whereby said variable resistance means prevents triggering of said thyristor when said critical temperature is exceeded.

15. The semiconductor device of claim 13 wherein said variable resistance means comprises a pair of spaced surface means with temperature coefficient resistance material located therebetween, one of said surface means abutting said control area and being substantially the same size as the control area, and said lead means includes a metal bridge for connecting the remaining surface means to one of said terminals.

16. The semiconductor device of claim 15 wherein said remaining surface means is of a size substantially equal to said surface means abutting said control area, and said bridge means abutting said remaining surface means is of a size substantially less than said remaining surface means.

17. The semiconductor device of claim 13 wherein said variable resistance means is composed of polycrystalline ceramic material with traces of impurity ions and has a positive temperature coefficient with a transition temperature above which the resistance thereof increases nonlinearly to values greatly in excess of values below said transition temperature, and said lead means mounts one of said terminals to said variable resistance means to position said polycrystalline ceramic material in series with said one terminal.

* * * * *

PO-1050
(5/69)

UNITED STATES PATENT OFFICE
CERTIFICATE OF CORRECTION

Patent No. 3,708,720 Dated January 2, 1973

Inventor(s) JOHN A. WHITNEY and RICHARD E. WOODS

It is certified that error appears in the above-identified patent and that said Letters Patent are hereby corrected as shown below:

Cover page, [22] Filed: "January 2, 1973" should be Filed: "June 14, 1971"

Signed and sealed this 10th day of July 1973.

(SEAL)
Attest:

EDWARD M.FLETCHER,JR.
Attesting Officer

Rene Tegtmeyer
Acting Commissioner of Patents